US012745411B2

(12) United States Patent
Iwakaji et al.

(10) Patent No.: US 12,745,411 B2
(45) Date of Patent: Sep. 22, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yoko Iwakaji, Tokyo (JP); Tomoko Matsudai, Tokyo (JP); Ryohei Gejo, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 373 days.

(21) Appl. No.: 18/242,844

(22) Filed: Sep. 6, 2023

(65) Prior Publication Data

US 2024/0322021 A1 Sep. 26, 2024

(30) Foreign Application Priority Data

Mar. 23, 2023 (JP) ................................ 2023-046893

(51) Int. Cl.
*H10D 12/00* (2025.01)
*H10D 8/00* (2025.01)
*H10D 62/17* (2025.01)

(52) U.S. Cl.
CPC ............. *H10D 12/481* (2025.01); *H10D 8/00* (2025.01); *H10D 62/393* (2025.01)

(58) Field of Classification Search
CPC ....... H10D 12/481; H10D 8/00; H10D 62/393
(Continued)

(56) References Cited

U.S. PATENT DOCUMENTS

2010/0264488 A1* 10/2010 Hsieh .................. H10D 30/668 257/334
2011/0049562 A1 3/2011 Suzuki et al.
(Continued)

FOREIGN PATENT DOCUMENTS

JP 2004363498 A * 12/2004 .......... H10D 62/051
JP 2011-049393 A 3/2011
(Continued)

OTHER PUBLICATIONS

Office Action issued in Japanese Patent Application No. 2023-046893, dated Mar. 3, 2026 in 16 pages.

*Primary Examiner* — Igwe U Anya
(74) *Attorney, Agent, or Firm* — Knobbe, Martens, Olson & Bear, LLP

(57) ABSTRACT

A semiconductor device includes a first electrode, a first semiconductor layer of a first conductivity type, a second semiconductor layer of a second conductivity type, a second electrode, a third electrode, a first insulating film, and a third semiconductor layer of the first conductivity type. The first semiconductor layer is connected to the first electrode. The second semiconductor layer contacts the first semiconductor layer. The second electrode is connected to the second semiconductor layer. The first insulating film is located between the third electrode and the first semiconductor layer and between the third electrode and the second semiconductor layer. The third semiconductor layer is located between the first insulating film and the first semiconductor layer. The third semiconductor layer contacts the first insulating film and the first semiconductor layer. The third semiconductor layer has a higher carrier concentration than the first semiconductor layer.

20 Claims, 12 Drawing Sheets

(58) Field of Classification Search
USPC .......................................................... 257/140
See application file for complete search history.

(56) References Cited

U.S. PATENT DOCUMENTS

| | | | | |
|---|---|---|---|---|
| 2012/0146091 | A1 | 6/2012 | Tanabe et al. | |
| 2014/0048847 | A1 | 2/2014 | Yamashita et al. | |
| 2015/0311326 | A1 | 10/2015 | Ogura et al. | |
| 2018/0350975 | A1* | 12/2018 | Kojima ................ | H10D 62/393 |
| 2019/0051648 | A1 | 2/2019 | Kakimoto et al. | |
| 2020/0194554 | A1* | 6/2020 | Adachi .................. | H10D 30/60 |
| 2021/0288143 | A1 | 9/2021 | Iwakaji et al. | |
| 2021/0296310 | A1 | 9/2021 | Itokazu et al. | |
| 2022/0069072 | A1* | 3/2022 | Hoshi .................. | H10D 62/107 |
| 2022/0102503 | A1 | 3/2022 | Hatta et al. | |
| 2022/0293778 | A1 | 9/2022 | Iwakaji et al. | |

FOREIGN PATENT DOCUMENTS

| | | | |
|---|---|---|---|
| JP | 2012-138567 | A | 7/2012 |
| JP | 2013-021240 | A | 1/2013 |
| JP | 2015-195366 | A | 11/2015 |
| JP | 5919121 | B2 | 5/2016 |
| JP | 5942737 | B2 | 6/2016 |
| JP | 6377309 | B1 | 8/2018 |
| JP | 6652173 | B2 | 2/2020 |
| JP | 6658021 | B2 | 3/2020 |
| JP | 2021-145077 | A | 9/2021 |
| JP | 2021-150528 | A | 9/2021 |
| JP | 2022-140291 | A | 9/2022 |
| WO | WO 2020/188686 | A1 | 9/2022 |

* cited by examiner

T1

T2

T3

T1
+
−
1
26
16
16
26
12
24
24a
h
27a(27)
20
e
23
22
11
−
T2
+
+
1
26
16
16
26
12
24
24b
27b(27)
h
20
e
23
22
11
−
T3
−
+
1
26
16
16
26
12
24
h
24b
27b(27)
20
23
e
22
11
+

4
19
12
26
24
p⁺ p⁺ p p⁺ p⁺
16
29
27
n n n n
27
18
p p
31
$n^-$
20
23
n
22
11

SEMICONDUCTOR DEVICE

CROSS-REFERENCE TO RELATED APPLICATIONS

This application is based upon and claims the benefit of priority from Japanese Patent Application No. 2023-046893, filed on Mar. 23, 2023; the entire contents of which are incorporated herein by reference.

FIELD

Embodiments relate to a semiconductor device.

BACKGROUND

A semiconductor device for power control has been proposed in which a gate control diode is embedded to carry return current. It is desirable to further reduce the power loss of such a semiconductor device.

DETAILED DESCRIPTION

According to one embodiment, a semiconductor device includes a first electrode, a first semiconductor layer, a second semiconductor layer, a second electrode, a third electrode, a first insulating film, and a third semiconductor layer. The first semiconductor layer is connected to the first electrode. The first semiconductor layer is of a first conductivity type. The second semiconductor layer contacts the first semiconductor layer. The second semiconductor layer is of a second conductivity type. The second electrode is connected to the second semiconductor layer. The first insulating film is located between the third electrode and the first semiconductor layer and between the third electrode and the second semiconductor layer. The first insulating film contacts the third electrode. The third semiconductor layer is located between the first insulating film and the first semiconductor layer in a second direction orthogonal to a first direction. The first direction is from the first electrode toward the second electrode. The third semiconductor layer contacts the first insulating film and the first semiconductor layer. The third semiconductor layer is of the first conductivity type. The third semiconductor layer has a higher carrier concentration than the first semiconductor layer.

First Embodiment

Figure 1:
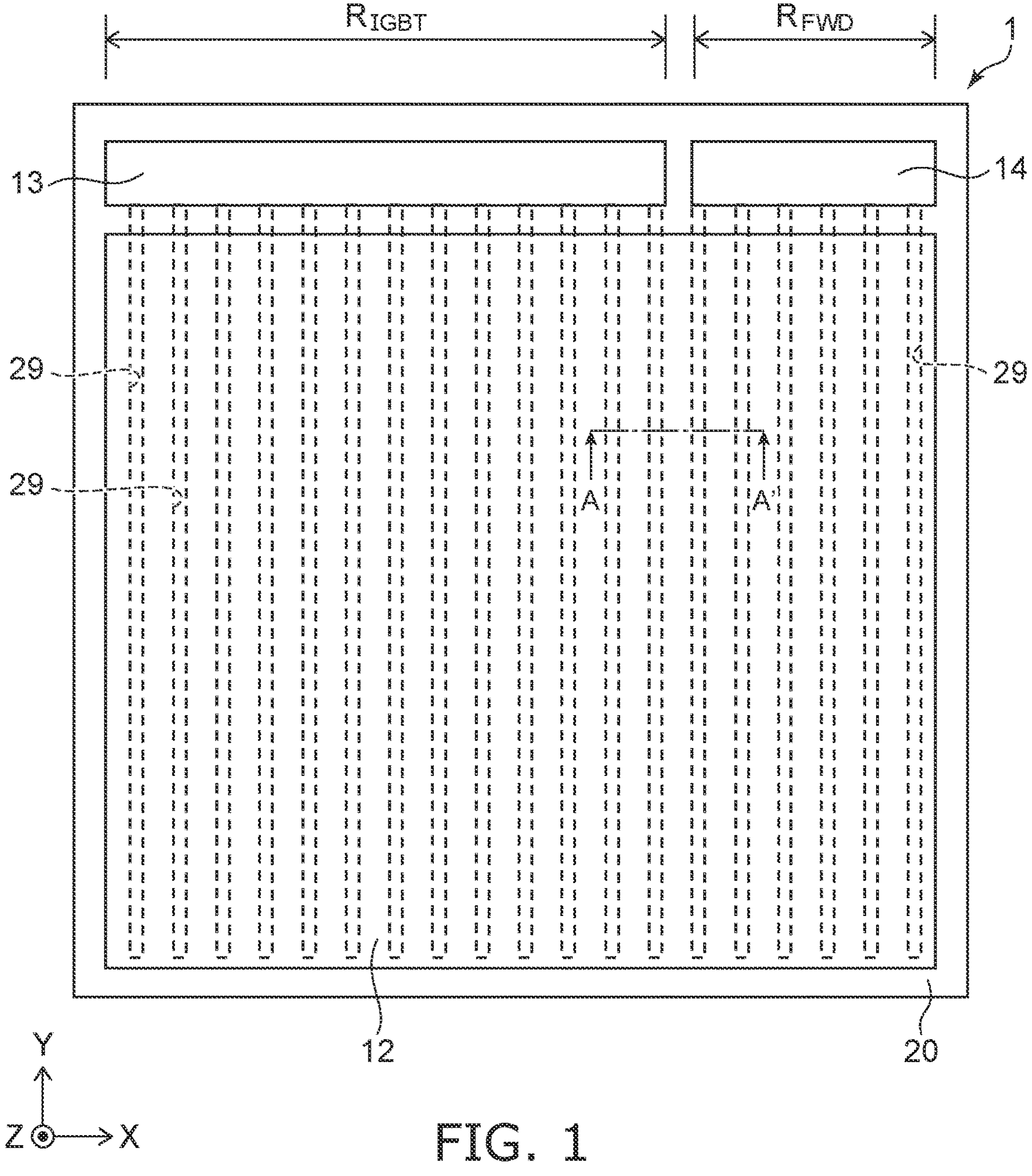
FIG. 1 is a plan view showing a semiconductor device according to a first embodiment.

FIG. 1 is a plan view showing a semiconductor device according to the embodiment.

Figure 2:
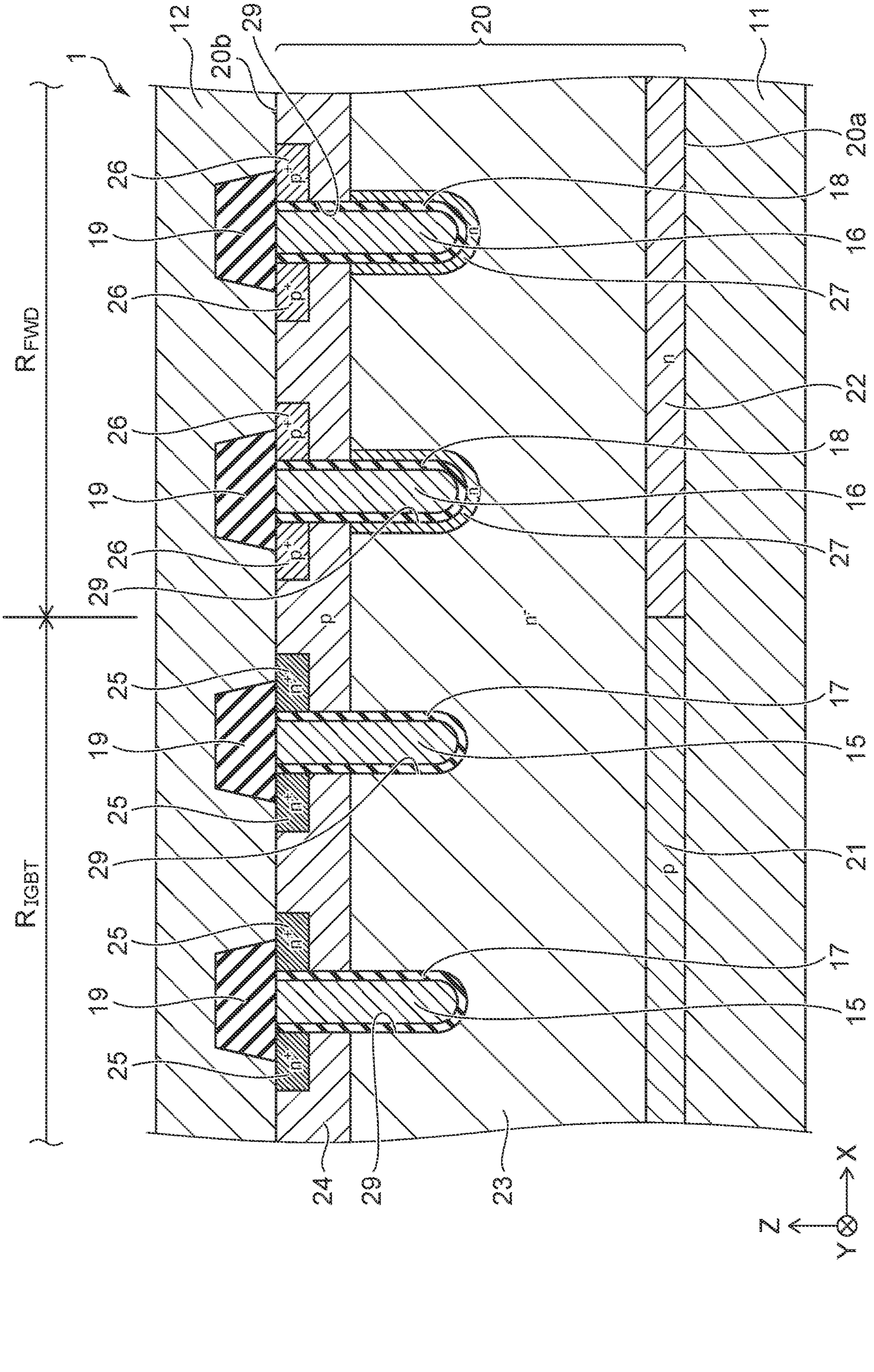
FIG. 2 is a cross-sectional view along line A-A' shown in FIG. 1.

FIG. 2 is a cross-sectional view along line A-A' shown in FIG. 1.

The drawings are schematic and are simplified or enhanced as appropriate. For example, the components are drawn to be larger and fewer than the actual components. The aspect ratios of the components are different from the actual aspect ratios. This is similar for the other drawings described below as well.

As shown in FIGS. 1 and 2, the semiconductor device 1 according to the embodiment is, for example, a reverse-conducting IGBT (Insulated Gate Bipolar Transistor). In the semiconductor device 1, an IGBT region $R_{IGBT}$ is set in which an IGBT is formed, and a FWD region $R_{FWD}$ is set in which a FWD (FreeWheeling Diode) is formed.

The semiconductor device 1 includes a lower surface electrode 11 (a first electrode), a semiconductor part 20, an upper surface electrode 12 (a second electrode), an IGBT gate pad 13, a FWD gate pad 14, an IGBT gate electrode 15 (a fourth electrode), a FWD gate electrode 16 (a third electrode), an IGBT gate insulating film 17 (a second insulating film), a FWD gate insulating film 18 (a first insulating film), and an insulating member 19. One of each of the lower surface electrode 11, the semiconductor part 20, the upper surface electrode 12, the IGBT gate pad 13, and the FWD gate pad 14 is provided. Pluralities of the IGBT gate electrode 15, the FWD gate electrode 16, the IGBT gate insulating film 17, the FWD gate insulating film 18, and the insulating member 19 are provided.

The semiconductor part 20 includes a p-type collector layer 21 (a fourth semiconductor layer), an n-type cathode layer 22, an $n^-$-type drift layer 23 (a first semiconductor layer), a p-type base/anode layer 24 (a second semiconductor layer), an $n^+$-type emitter layer 25, a $p^+$-type contact layer 26, and a sidewall n-type layer 27 (a third semiconductor layer). For example, one of each of the p-type collector layer 21, the n-type cathode layer 22, the $n^-$-type drift layer 23, and the p-type base/anode layer 24 is provided. Pluralities of the $n^+$-type emitter layer 25 (the fifth semiconductor layer), the $p^+$-type contact layer 26, and the sidewall n-type layer 27 are provided.

An XYZ orthogonal coordinate system is employed for convenience of description in the specification hereinbelow. The direction from the lower surface electrode 11 toward the upper surface electrode 12 is taken as a "Z-direction"; the direction from the IGBT region $R_{IGBT}$ toward the FWD region $R_{FWD}$ is taken as an "X-direction"; and a direction orthogonal to the Z-direction and the X-direction is taken as a "Y-direction". Among the Z-directions, a direction that is from the lower surface electrode 11 toward the upper surface electrode 12 also is called "up", and the opposite direction also is called "down", but these expressions are for convenience and are independent of the direction of gravity.

The semiconductor part 20 has a chip shape and has, for example, a rectangular plate shape. The semiconductor part 20 is made of a semiconductor material and is made of, for example, single-crystal silicon (Si); and each part of the semiconductor part 20 is provided with a conductivity type and carrier concentration by appropriately introducing impurities. "Carrier concentration" refers to the effective impurity concentration contributing to the conductivity of the semiconductor material, and refers to the concentration excluding the cancelled portion when both an impurity that forms acceptors and an impurity that forms donors are included in the same portion.

The lower surface electrode 11 is located on the entire surface of a lower surface 20*a* of the semiconductor part 20. The lower surface electrode 11 contacts the lower surface 20*a*. The upper surface electrode 12, the IGBT gate pad 13, and the FWD gate pad 14 are provided to be separated from each other on an upper surface 20*b* of the semiconductor part 20. For example, the upper surface electrode 12 is located in substantially the entire region of the upper surface 20*b* other than the end portion of the upper surface 20*b* at the +Y direction side; the IGBT gate pad 13 is located at the end portion of the upper surface 20*b* at the +Y direction side of the IGBT region $R_{IGBT}$; and the FWD gate pad 14 is located at the end portion of the upper surface 20*b* at the +Y direction side of the FWD region $R_{FWD}$.

Multiple trenches 29 are formed in the semiconductor part 20 from the upper surface 20*b* side. The multiple trenches 29 are arranged along the X-direction. Each trench 29 has a stripe shape extending in the Y-direction. In the IGBT region $R_{IGBT}$, the IGBT gate insulating film 17 is located on the inner surface of the trench 29; and the IGBT gate electrode 15 is located on the inner 10 surface of the IGBT gate insulating film 17. The IGBT gate electrode 15 is connected to the IGBT gate pad 13 at the longitudinal-direction end portion of the IGBT gate electrode 15. In the FWD region $R_{FWD}$, the FWD gate insulating film 18 is located on the inner surface of the trench 29; and the FWD gate electrode 16 is located on the inner surface of the FWD gate insulating film 18. The FWD gate electrode 16 is connected to the FWD gate pad 14 at the longitudinal-direction end portion of the FWD gate electrode 16. The IGBT gate pad 13 and the FWD gate pad 14 are insulated from each other. Therefore, mutually-independent voltages can be applied to the IGBT gate electrode 15 and the FWD gate electrode 16.

The p-type collector layer 21 is located in the lower portion of the semiconductor part 20 in the IGBT region $R_{IGBT}$. The p-type collector layer 21 contacts the lower surface electrode 11 and is thereby connected to the lower surface electrode 11. "Connected" refers to an electrical connection in the specification. The conductivity type of the p-type collector layer 21 is the p-type.

The n-type cathode layer 22 is located in the lower portion of the semiconductor part 20 in the FWD region $R_{FWD}$. The n-type cathode layer 22 contacts the lower surface electrode 11 and is thereby connected to the lower surface electrode 11. The conductivity type of the n-type cathode layer 22 is the n-type.

The $n^-$-type drift layer 23 is located on the p-type collector layer 21 and on the n-type cathode layer 22 and contacts the p-type collector layer 21 and the n-type cathode layer 22. The $n^-$-type drift layer 23 spreads over the entire semiconductor part 20 along the XY plane. The conductivity type of the n-type drift layer 23 is the n-type; and the n-type drift layer 23 has a lower carrier concentration than the n-type cathode layer 22. The $n^-$-type drift layer 23 is connected to the lower surface electrode 11 via the n-type cathode layer 22.

The p-type base/anode layer 24 is located on the $n^-$-type drift layer 23 and contacts the n-type drift layer 23. The p-type base/anode layer 24 spreads along the XY plane in the part of the semiconductor part 20 other than the termination part. The p-type base/anode layer 24 may be divided into a p-type base layer located in the IGBT region $R_{IGBT}$ and a p-type anode layer located in the FWD region $R_{FWD}$. The conductivity type of the p-type base/anode layer 24 is the p-type; and the p-type base/anode layer 24 has a lower carrier concentration than the p-type collector layer 21.

The $n^+$-type emitter layer 25 is located on a portion of the p-type base/anode layer 24 in the IGBT region $R_{IGBT}$. Multiple $n^+$-type emitter layers 25 are arranged along the X-direction. The conductivity type of the $n^+$-type emitter layer 25 is the n-type; and the $n^+$-type emitter layer 25 has a higher carrier concentration than the n-type drift layer 23. In the IGBT region $R_{IGBT}$, the $n^+$-type emitter layer 25 and the p-type base/anode layer 24 contact the upper surface electrode 12 and are thereby connected to the upper surface electrode 12.

The $p^+$-type contact layer 26 is located on a portion of the p-type base/anode layer 24 in the FWD region $R_{FWD}$. Multiple $p^+$-type contact layers 26 are arranged along the X-direction. The conductivity type of the $p^+$-type contact layer 26 is the p-type; and the $p^+$-type contact layer 26 has a higher carrier concentration than the p-type base/anode layer 24. In the FWD region $R_{FWD}$, the p-type base/anode layer 24 and the $p^+$-type contact layer 26 contact the upper surface electrode 12 and are thereby connected to the upper surface electrode 12.

The trench 29 extends in the Y-direction; and the IGBT gate electrode 15, the FWD gate electrode 16, the $n^+$-type emitter layer 25, the $p^+$-type contact layer 26, the sidewall n-type layer 27, and the insulating member 19 also extend in the Y-direction. The trench 29 extends through the $n^+$-type emitter layer 25, the $p^+$-type contact layer 26, and the p-type base/anode layer 24 in the Z-direction and penetrates partway through the $n^-$-type drift layer 23. Accordingly, the lower end of the trench 29 is positioned in the $n^-$-type drift layer 23.

Therefore, the IGBT gate insulating film 17 is located between the IGBT gate electrode 15 and the n-type drift layer 23, between the IGBT gate electrode 15 and the p-type base/anode layer 24, and between the IGBT gate electrode 15 and the $n^+$-type emitter layer 25, and contacts these components. The IGBT gate insulating film 17 is separated from the p-type collector layer 21.

Similarly, the FWD gate insulating film 18 is located between the FWD gate electrode 16 and the n-type drift layer 23, between the FWD gate electrode 16 and the p-type base/anode layer 24, and between the FWD gate electrode 16 and the $p^+$-type contact layer 26, and contacts these components. The FWD gate insulating film 18 is separated from the n-type cathode layer 22.

The sidewall n-type layer 27 is located, for example, over the entire region between the FWD gate insulating film 18 and the $n^-$-type drift layer 23 and contacts the FWD gate insulating film 18 and the $n^-$-type drift layer 23. In other words, the sidewall n-type layer 27 is located between the FWD gate insulating film 18 and the $n^-$-type drift layer 23 in the X-direction and is located between the FWD gate insulating film 18 and the n-type drift layer 23 in the Z-direction. The Z-direction length of the sidewall n-type layer 27 is greater than the Z-direction length of the p-type base/anode layer 24. The conductivity type of the sidewall n-type layer 27 is the n-type; and the sidewall n-type layer 27 has a higher carrier concentration than the $n^-$-type drift layer 23. For example, the sidewall n-type layer 27 can be formed by forming the trench 29 in the semiconductor part 20 and then ion-implanting an impurity that forms donors into the semiconductor part 20 via the trench 29.

According to the embodiment, the sidewall n-type layer 27 is not provided between the FWD gate insulating film 18 and the p-type base/anode layer 24 or between the FWD gate insulating film 18 and the $p^+$-type contact layer 26. Therefore, the p-type base/anode layer 24 and the $p^+$-type contact layer 26 contact the FWD gate insulating film 18. Also, the sidewall n-type layer 27 is not provided between the IGBT gate insulating film 17 and the n-type drift layer 23. Therefore, the IGBT gate insulating film 17 contacts the $n^-$-type drift layer 23.

The insulating member 19 is located on the semiconductor part 20 between the IGBT gate electrode 15 and the upper surface electrode 12 and between the FWD gate electrode 16 and the upper surface electrode 12. Accordingly, the IGBT gate electrode 15 and the FWD gate electrode 16 are insulated from the upper surface electrode 12 by the insulating member 19.

By such a configuration, an IGBT is formed in the IGBT region $R_{IGBT}$ in which the lower surface electrode 11 is a collector, the upper surface electrode 12 is an emitter, the $n^-$-type drift layer 23 is an n-type base, the p-type base/anode layer 24 is a p-type base, and the IGBT gate electrode 15 is a gate. In the FWD region $R_{FWD}$, a gate control diode is formed in which the lower surface electrode 11 is a cathode, the upper surface electrode 12 is an anode, and the FWD gate electrode 16 is a gate. Accordingly, the semiconductor device 1 functions as a reverse-conducting IGBT.

Operations of the semiconductor device according to the embodiment will now be described.

Figure 3:
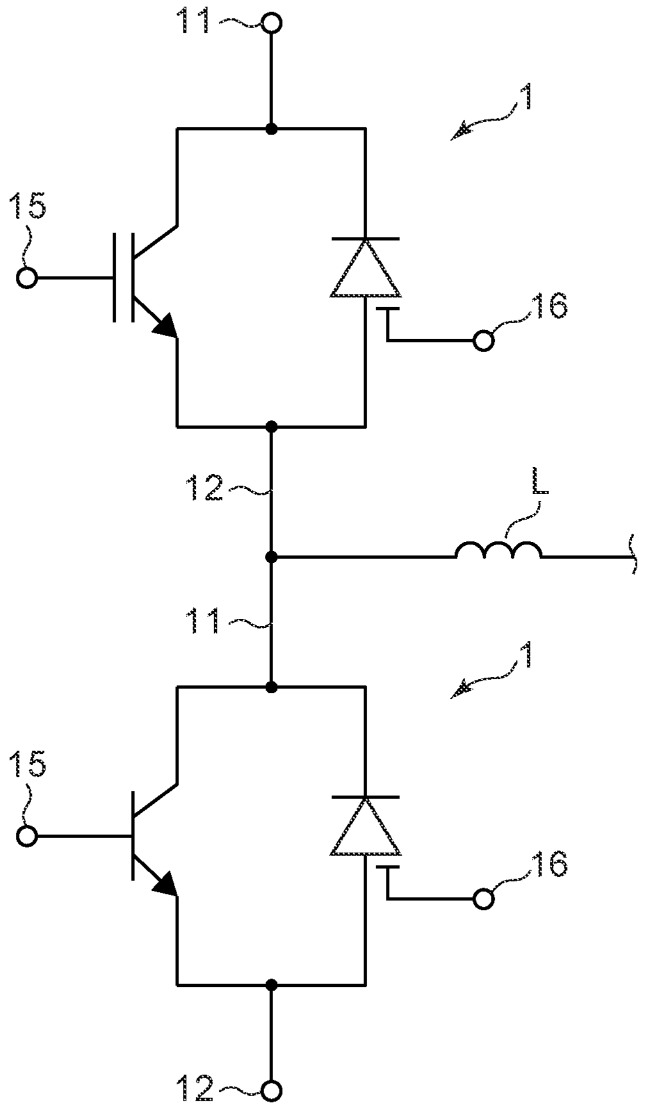
FIG. 3 is a circuit diagram showing the semiconductor device according to the first embodiment.

FIG. 3 is a circuit diagram showing the semiconductor device according to the embodiment.

As shown in FIG. 3, a half-bridge circuit is configured by connecting, for example, two semiconductor devices 1 according to the embodiment in series. As described above, the semiconductor device 1 is an RC-IGBT; in FIG. 3, the symbol representing the IGBT corresponds to the IGBT region $R_{IGBT}$; and the symbol representing the diode corresponds to the FWD region $R_{FWD}$. The gate voltage of the IGBT is applied between the gate (the IGBT gate electrode 15) and the emitter (the upper surface electrode 12); and the gate voltage of the FWD is applied between the gate (the FWD gate electrode 16) and the anode (the upper surface electrode 12). In the example shown in FIG. 3, the diode of the semiconductor device 1 of the upper arm performs a recovery operation when the IGBT of the semiconductor device 1 of the lower arm is turned on. The details will now be described.

First, the operation of the IGBT region $R_{IGBT}$ of the semiconductor device 1 will be described.

As shown in FIGS. 1 and 2, a voltage is applied between the lower surface electrode 11 and the upper surface electrode 12 so that the lower surface electrode 11 is positive and the upper surface electrode 12 is negative. Accordingly, a depletion layer spreads with the interface between the $n^-$-type drift layer 23 and the p-type base/anode layer 24 as a starting point. When a positive voltage, e.g., +15 V, is applied to the IGBT gate electrode 15 in this state, an inversion layer is formed in the portion of the p-type base/anode layer 24 contacting the IGBT gate insulating film 17, which causes conduction between the lower surface electrode 11 and the upper surface electrode 12. At this time, electrons are introduced from the upper surface electrode 12 via the $n^+$-type emitter layer 25; and holes are introduced from the lower surface electrode 11 via the p-type collector layer 21. On the other hand, the inversion layer disappears when a negative voltage, e.g., −15 V, is applied to the IGBT gate electrode 15. Accordingly, the conduction between the lower surface electrode 11 and the upper surface electrode 12 ends.

The operation of the FWD region $R_{FWD}$ will now be described.

Figure 4:
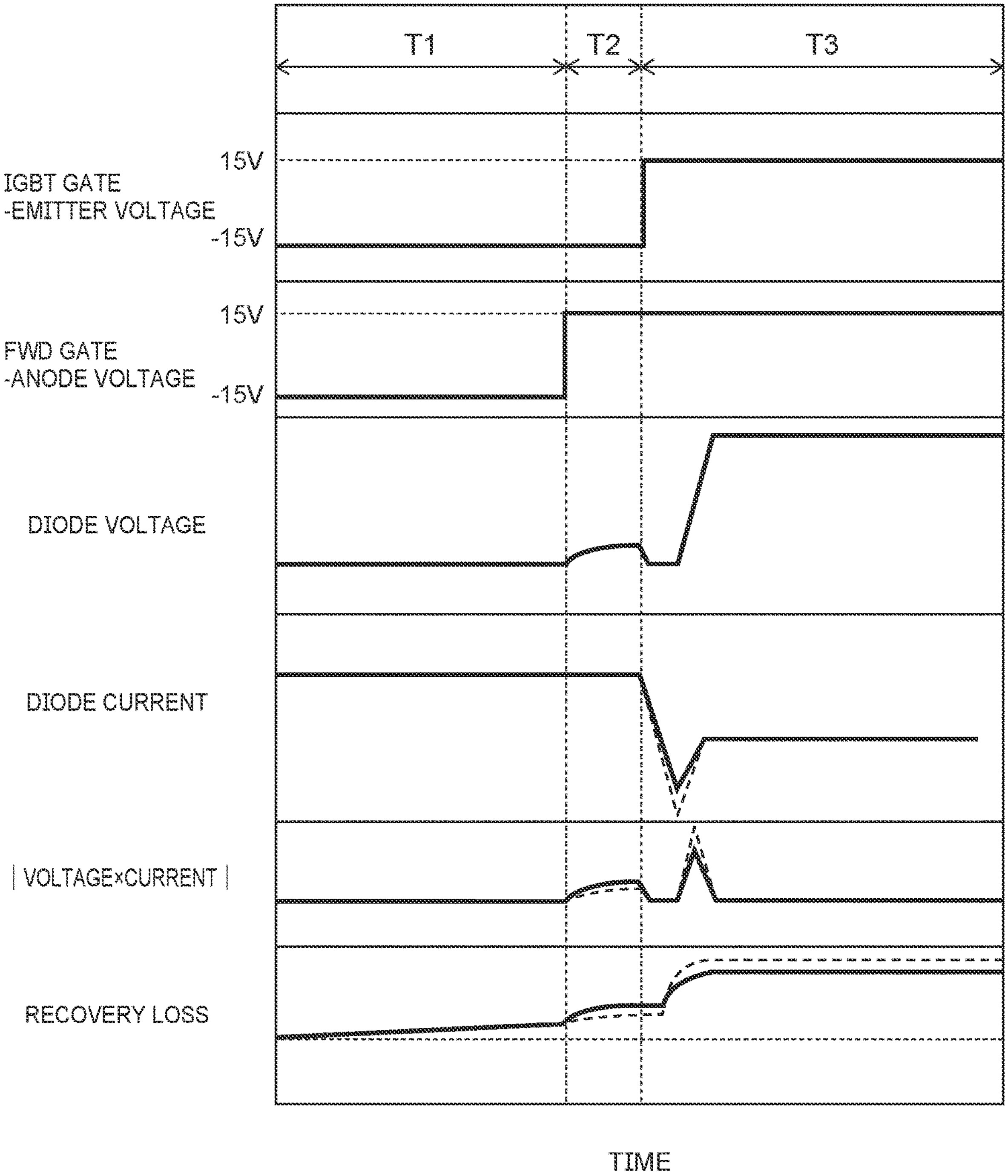
FIG. 4 is a timing chart showing operations of the semiconductor device according to the first embodiment, in which the horizontal axis is time, and the vertical axis shows each value.

FIG. 4 is a timing chart showing operations of the semiconductor device according to the embodiment, in which the horizontal axis is time, and the vertical axis shows each value.

Figure 5A:
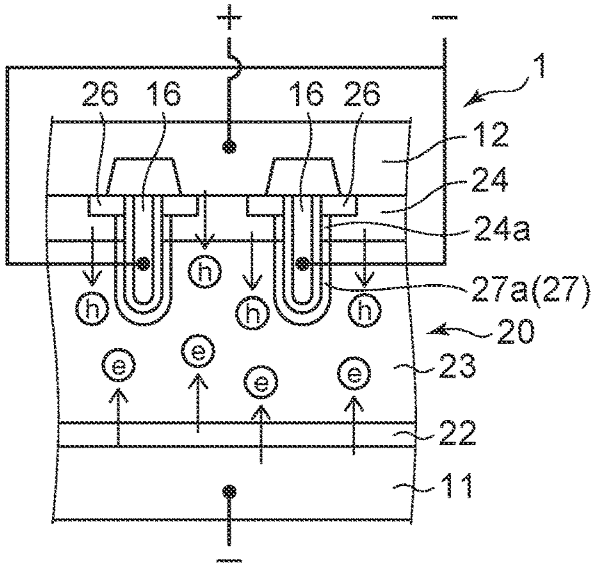
FIGS. 5A to 5C are cross-sectional views showing operations of the semiconductor device according to first the embodiment.
Figure 5B:
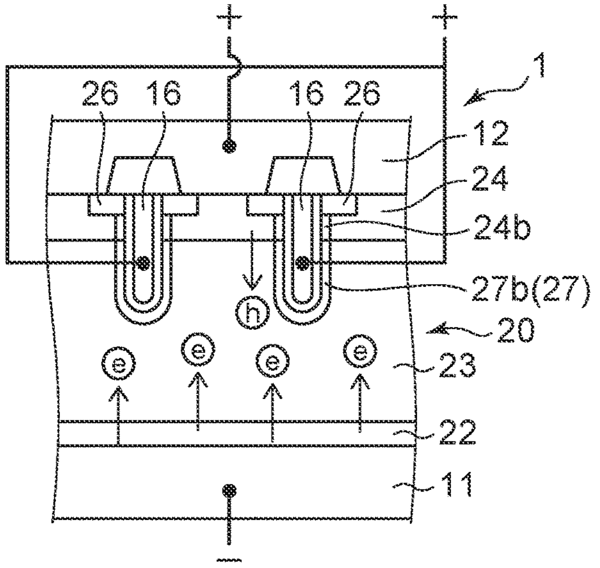
Figure 5C:
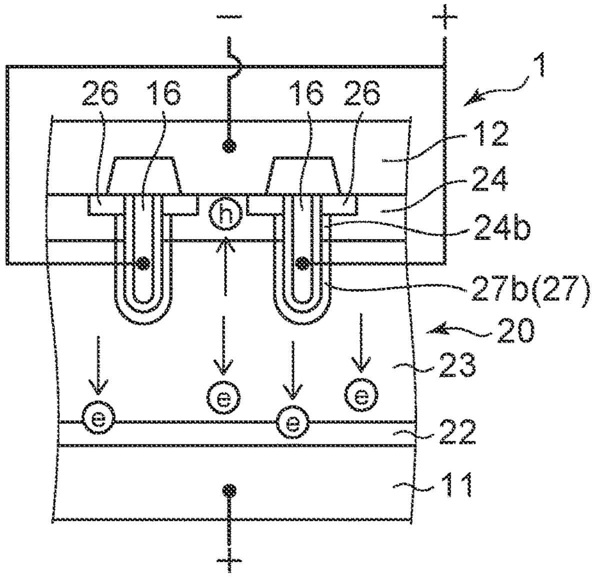

FIGS. 5A to 5C are cross-sectional views showing operations of the semiconductor device according to the embodiment.

Among the items shown on the vertical axis of FIG. 4, "IGBT gate voltage" is the voltage of the IGBT gate electrode 15 of the semiconductor device 1 of the lower arm shown in FIG. 3, and the other items are the items of the semiconductor device 1 of the upper arm shown in FIG. 3.

"Recovery loss" shown in FIG. 4 is the time integral of the absolute value (|voltage×current|) of the product of the diode voltage applied to the diode (FWD) and the diode current flowing in the diode.

A case where the sidewall n-type layer 27 is not provided is illustrated by broken lines as a comparative example in portions of the graph of FIG. 4.

In FIGS. 5A to 5C, electrons are illustrated by symbols of the character "e" surrounded with a circle; and holes are illustrated by symbols of the character "h" surrounded with a circle.

After a negative voltage is applied to the IGBT gate electrode 15 of the semiconductor device 1 of the lower arm and the IGBT region $R_{IGBT}$ does not conduct as shown in the FWD conduction period T1 of FIGS. 4 and 5A, there are cases where a return current flows in the semiconductor device 1 of the upper arm due to an inductance L outside the semiconductor device 1 of the upper arm. At this time, the upper surface electrode 12 has a positive voltage with respect to the lower surface electrode 11; and the diode of the FWD region $R_{FWD}$ conducts. Electrons are therefore injected from the lower surface electrode 11 via the n-type cathode layer 22 and the $n^-$-type drift layer 23; and holes are injected from the upper surface electrode 12 via the $p^+$-type contact layer 26 and the p-type base/anode layer 24.

By setting the FWD gate electrode 16 to a negative voltage, a p-type accumulation layer 24*a* is formed in the portion of the p-type base/anode layer 24 contacting the FWD gate insulating film 18; and a p-type inversion layer 27*a* is formed in the sidewall n-type layer 27. As a result, holes also are injected via the p-type accumulation layer 24*a* and the p-type inversion layer 27*a*, which increases the hole injection amount as the entirety and reduces the conduction loss.

Then, in a period T2 directly before the recovery operation of FIG. 4, a positive voltage, e.g., +15 V, is applied to the FWD gate electrode 16 of the semiconductor device 1 of the upper arm. As shown in FIG. 5B, an n-type inversion layer 24*b* is thereby formed in the portion of the p-type base/anode layer 24 contacting the FWD gate insulating film 18; and an n-type accumulation layer 27*b* is formed in the sidewall n-type layer 27. As a result, the total dose of the p-type portions of the semiconductor part 20 is reduced; therefore, the holes that are injected are limited, and the amount of holes in the semiconductor part 20 is reduced. The length of the period T2 directly before the recovery operation is, for example, not less than 1 μs and not more than 10 μs, e.g., 5 μs.

Then, in a recovery operation period T3 of FIG. 4, the IGBT gate electrode 15 is set to a positive voltage. The upper surface electrode 12 has the same voltage as the lower surface electrode 11 or a negative voltage with respect to the lower surface electrode 11; holes that had penetrated the semiconductor part 20 are discharged from the upper surface electrode 12; and the electrons that had penetrated the semiconductor part 20 are discharged from the lower surface electrode 11. The charge that is discharged is a recovery loss. According to the embodiment, the injection of holes in the period T2 directly before the recovery operation is limited; therefore, the holes that exist in the semiconductor part 20 at the start of the recovery operation period T3 is low, and the recovery loss can be reduced. Because the FWD gate electrode 16 remains as the positive voltage in the recovery operation period T3, the n-type inversion layer 24*b* and the n-type accumulation layer 27*b* are maintained.

In the comparative example in which the sidewall n-type layer 27 is not provided as illustrated by the broken line in FIG. 4, the injection of holes in the period T2 directly before the recovery operation is not limited, and many holes are discharged from the interior of the semiconductor part 20 into the upper surface electrode 12 in the recovery operation period T3. As a result, the recovery loss is increased.

Effects of the embodiment will now be described.

According to the embodiment, by providing the FWD gate electrode 16 and applying a positive voltage to the FWD gate electrode 16 in the period T2 directly before the recovery operation, the n-type inversion layer 24*b* can be formed in the p-type base/anode layer 24, and the n-type accumulation layer 27*b* can be formed in the sidewall n-type layer 27. The injection of holes in the period T2 directly before the recovery operation can be limited thereby, and the recovery loss in the recovery operation period T3 can be reduced.

According to the embodiment, by providing the sidewall n-type layer 27, the donor concentration of the n-type accumulation layer 27*b* in the period T2 directly before the recovery operation can be increased, and the injection of holes can be more effectively suppressed. The recovery loss in the recovery operation period T3 can be reduced even further thereby.

Second Embodiment

The configuration of a semiconductor device according to the embodiment is similar to that of the first embodiment.

The operations of the semiconductor device according to the embodiment are different from those of the first embodiment.

Figure 6:
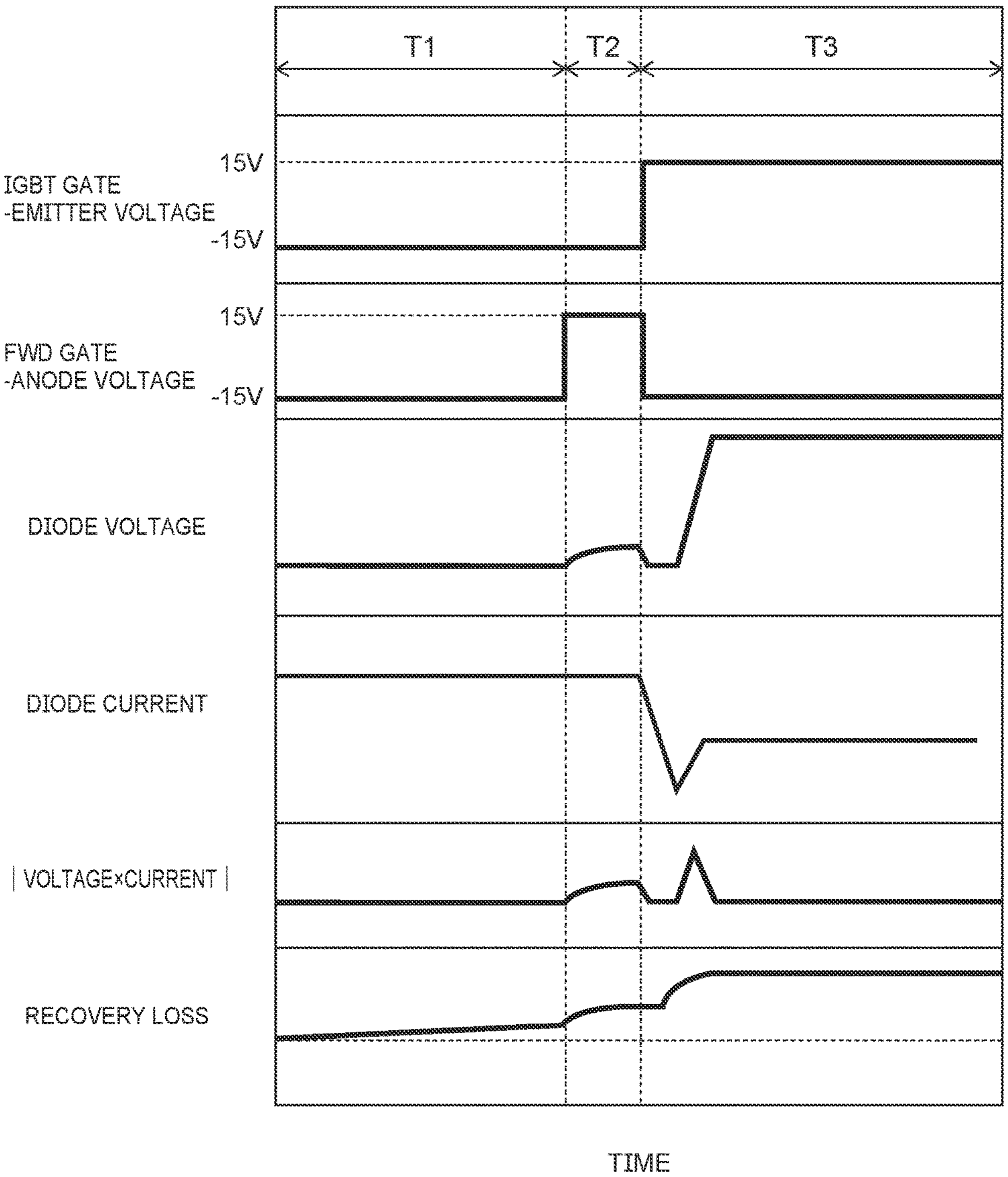
FIG. 6 is a timing chart showing operations of a semiconductor device according to a second embodiment, in which the horizontal axis is time, and the vertical axis is the voltage or current.

FIG. 6 is a timing chart showing operations of the semiconductor device according to the embodiment, in which the horizontal axis is time, and the vertical axis is the voltage or current.

According to the embodiment as shown in FIG. 6, the voltage of the FWD gate electrode 16 is switched from the positive voltage to the negative voltage when transitioning from the period T2 directly before the recovery operation to the recovery operation period T3. Accordingly, in the recovery operation period T3, the n-type inversion layer 24*b* and the n-type accumulation layer 27*b* shown in FIG. 5B disappear, and the p-type accumulation layer 24*a* and the p-type inversion layer 27*a* shown in FIG. 5A are formed. As a result, the discharge of holes in the recovery operation period T3 is promoted. Otherwise, the configuration, operations, and effects according to the embodiment are similar to those of the first embodiment.

Third Embodiment

Figure 7:
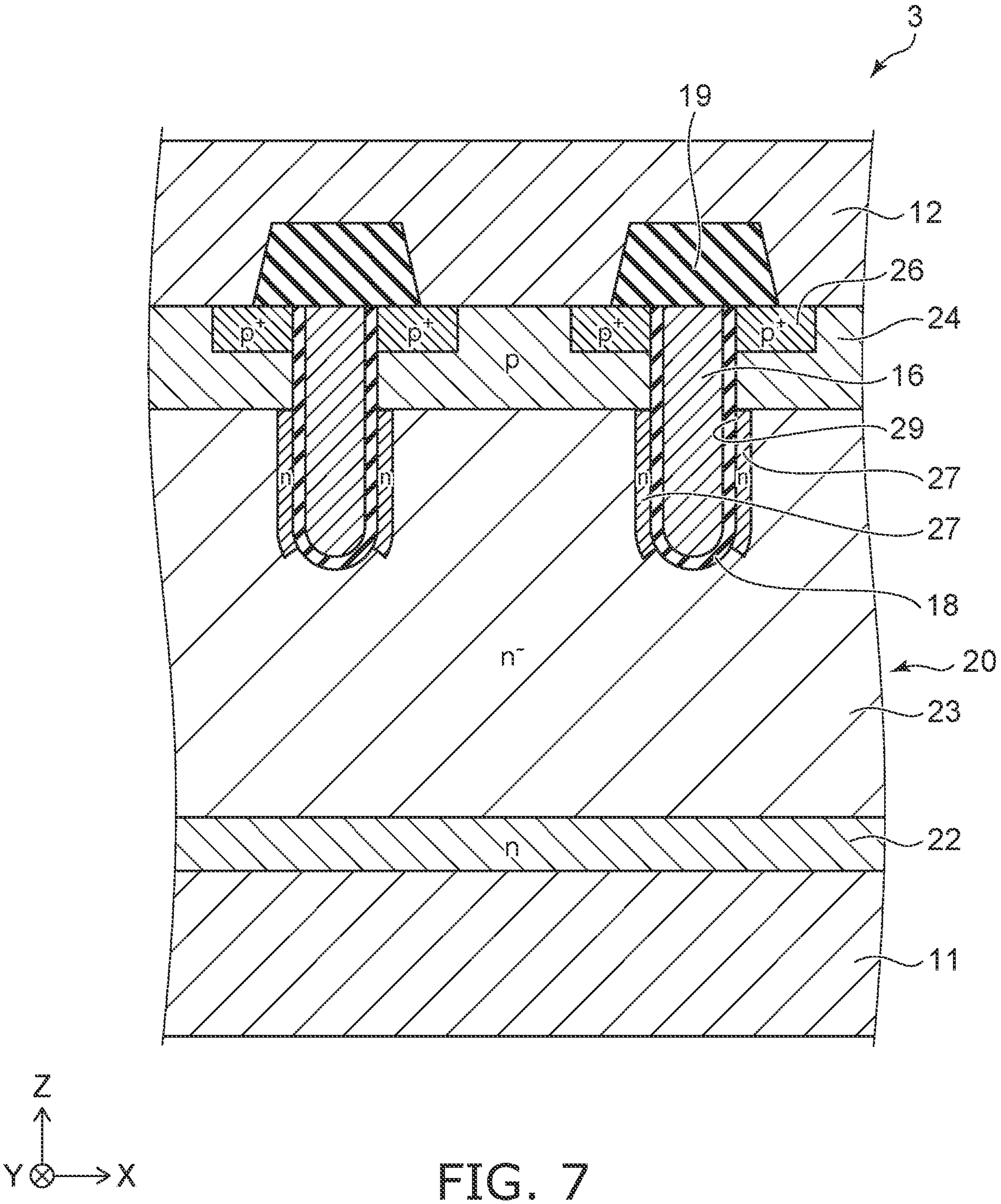
FIG. 7 is a cross-sectional view showing a semiconductor device according to a third embodiment.

FIG. 7 is a cross-sectional view showing a semiconductor device according to the embodiment.

In FIG. 7, only the FWD region $R_{FWD}$ of the semiconductor device is shown, and the IGBT region $R_{IGBT}$ is not illustrated. This is similar for FIG. 8 and FIGS. 10 to 12 below.

In the semiconductor device 3 according to the embodiment as shown in FIG. 7, the sidewall n-type layer 27 is not provided between the FWD gate insulating film 18 and the $n^-$-type drift layer 23 in the Z-direction. Therefore, the lower end of the FWD gate insulating film 18 contacts the $n^-$-type drift layer 23. The sidewall n-type layer 27 is located at the two X-direction sides of the FWD gate insulating film 18.

According to the embodiment, for example, the sidewall n-type layer 27 can be formed by forming the trench 29 in the semiconductor part 20, then ion-implanting an impurity that forms donors via the trench 29, and subsequently counter-doping an impurity that forms acceptors via the trench 29. Otherwise, the configuration, operations, and effects according to the embodiment are similar to those of the first embodiment.

Fourth Embodiment

Figure 8:
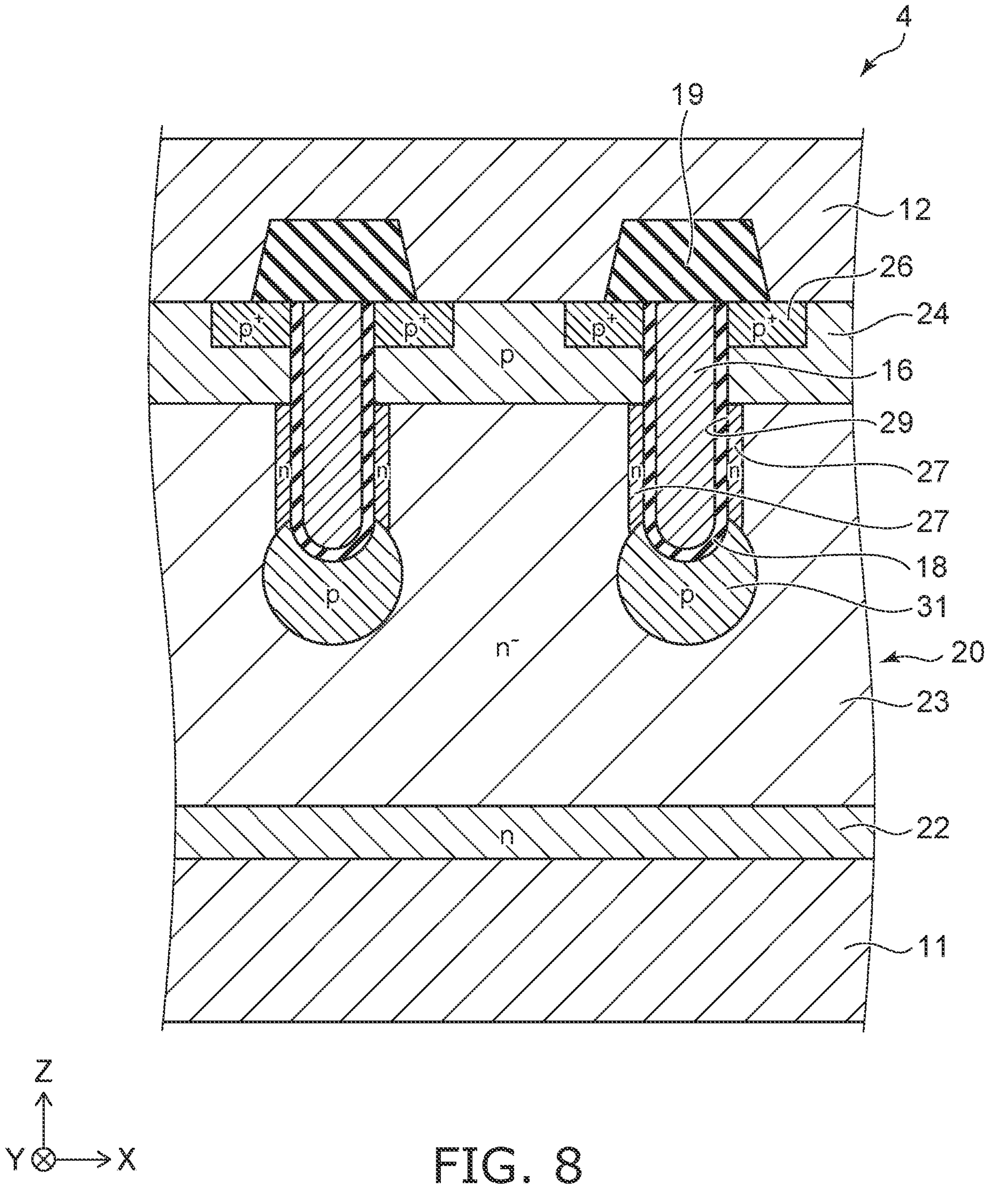
FIG. 8 is a cross-sectional view showing a semiconductor device according to a fourth embodiment.

FIG. 8 is a cross-sectional view showing a semiconductor device according to the embodiment.

In the semiconductor device 4 according to the embodiment as shown in FIG. 8, a bottom p-type layer 31 is located at the bottom portion of the trench 29. The conductivity type of the bottom p-type layer 31 is the p-type. The bottom p-type layer 31 is located between the FWD gate insulating film 18 and the $n^-$-type drift layer 23 in the Z-direction. The bottom p-type layer 31 contacts the FWD gate insulating film 18, the $n^-$-type drift layer 23, and the sidewall n-type layer 27 but does not contact the n-type cathode layer 22. The bottom p-type layers 31 are separated from each other by the n-type drift layer 23 in the X-direction.

According to the embodiment, by providing the bottom p-type layer 31 at the bottom portion of the trench 29, concentration of the electric field at the bottom portion of the trench 29 when a negative voltage is applied to the FWD gate electrode 16 can be relaxed. Accordingly, the voltage that is applied to the portion of the FWD gate insulating film 18 located at the bottom portion of the trench 29 can be reduced, and dielectric breakdown of this portion can be suppressed. As a result, the breakdown voltage between the lower surface electrode 11 and the upper surface electrode 12 can be increased. Otherwise, the configuration, operations, and effects according to the embodiment are similar to those of the first embodiment.

Modification of Fourth Embodiment

Figure 9:
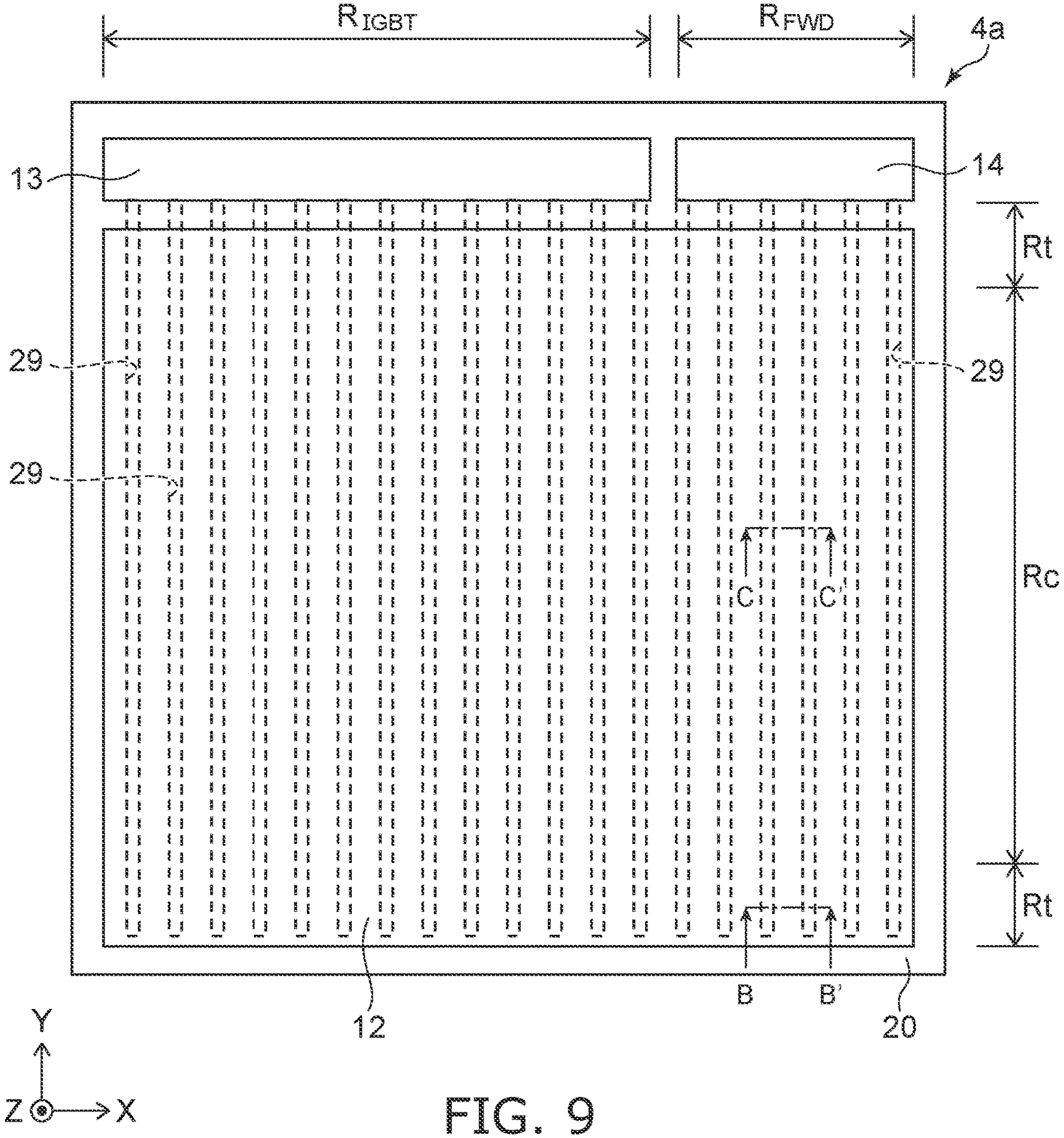
FIG. 9 is a plan view showing a semiconductor device according to a modification of the fourth embodiment.

FIG. 9 is a plan view showing a semiconductor device according to the modification.

The cross section along line B-B' shown in FIG. 9 is as shown in FIG. 7; and the cross section along line C-C' shown in FIG. 9 is as shown in FIG. 7.

In the semiconductor device 4*a* according to the modification as shown in FIGS. 7 to 9, a central region Rc and termination regions Rt are set in the region in which the trench 29 is located. The termination regions Rt are proximate to the edges of the semiconductor device 4*a* at the two Y-direction sides; and the central region Rc is distant to the edges of the semiconductor device 4*a* at the two Y-direction sides and includes, for example, the Y-direction center of the semiconductor device 4*a*. In the semiconductor device 4*a*, the termination region Rt is set at two locations; and the central region Rc is set at one location between the two termination regions Rt. The bottom p-type layer 31 is provided in the termination regions Rt, and is not provided in at least a partial region of the central region Rc. In other words, the bottom p-type layer 31 is located between the n-type drift layer 23 and the Y-direction end portions of the FWD gate electrode 16, but is not provided in at least a partial region between the $n^-$-type drift layer 23 and the Y-direction central portion of the FWD gate electrode 16.

According to the modification, the breakdown voltage between the lower surface electrode 11 and the FWD gate electrode 16 can be effectively improved in the termination region Rt in which the electric field easily concentrates. Otherwise, the configuration, operations, and effects according to the modification are similar to those of the fourth embodiment.

Fifth Embodiment

Figure 10:
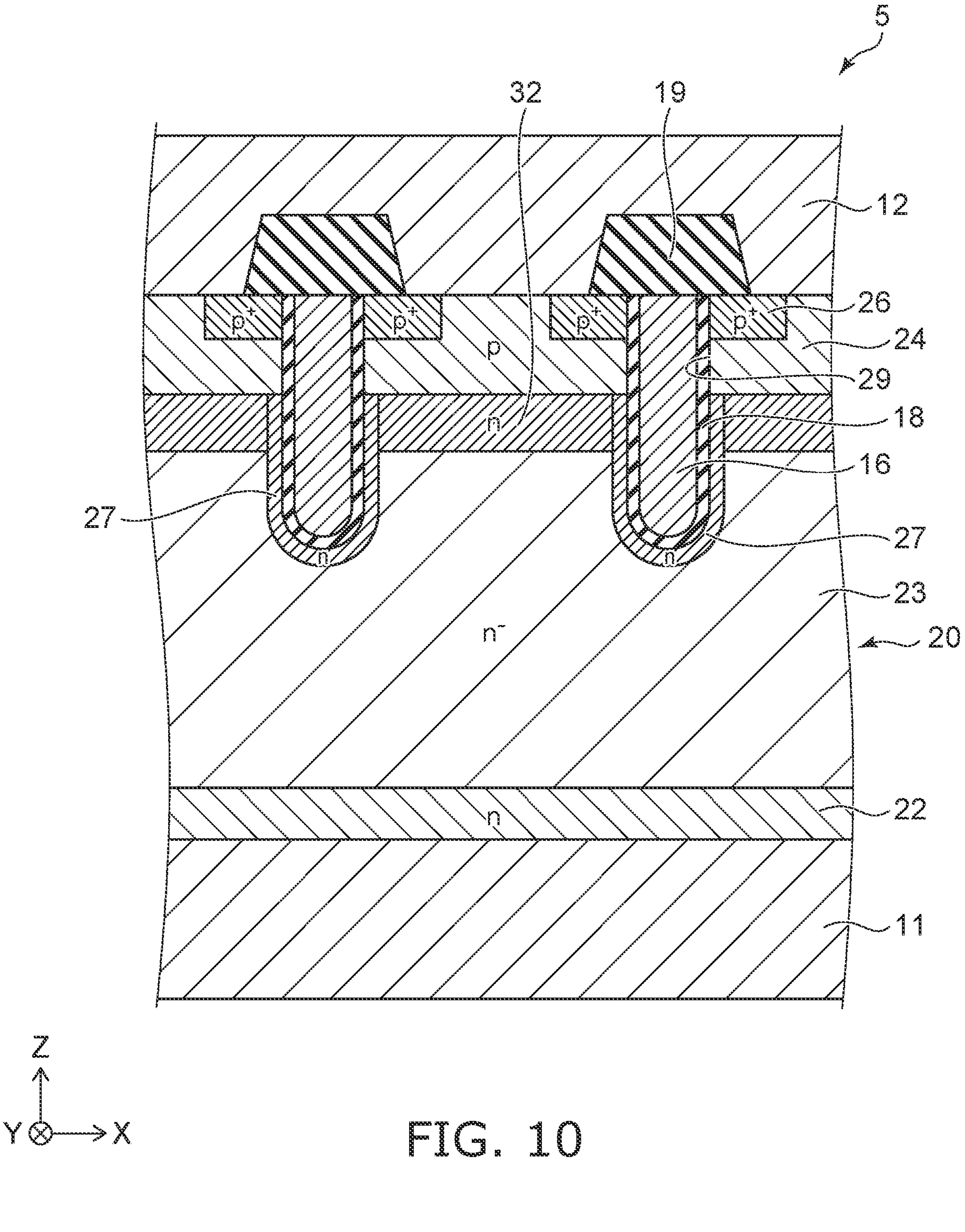
FIG. 10 is a cross-sectional view showing a semiconductor device according to a fifth embodiment.

FIG. 10 is a cross-sectional view showing a semiconductor device according to the embodiment.

As shown in FIG. 10, the semiconductor device 5 according to the embodiment includes an n-type barrier layer 32. The conductivity type of the n-type barrier layer 32 is the n-type; and the n-type barrier layer 32 has a higher carrier concentration than the $n^-$-type drift layer 23. The n-type barrier layer 32 is located between the $n^-$-type drift layer 23 and the p-type base/anode layer 24 and contacts the $n^-$-type drift layer 23, the p-type base/anode layer 24, and the sidewall n-type layer 27.

When the carrier concentration of the n-type barrier layer 32 is substantially equal to the carrier concentration of the sidewall n-type layer 27, the n-type barrier layer 32 and the sidewall n-type layer 27 are formed to have a continuous body and a distinct boundary is not observed between the n-type barrier layer 32 and the sidewall n-type layer 27. In the semiconductor device 5, the $n^-$-type drift layer 23 does not contact the p-type base/anode layer 24 and is separated from the p-type base/anode layer 24 by the n-type barrier layer 32. According to the embodiment, a third semiconductor layer includes the sidewall n-type layer 27 and the n-type barrier layer 32.

According to the embodiment, by providing the n-type barrier layer 32, holes are injected less easily in the period T2 directly before the recovery operation; and the recovery loss in the recovery operation period T3 can be further reduced. Otherwise, the configuration, operations, and effects according to the embodiment are similar to those of the first embodiment.

Sixth Embodiment

Figure 11:
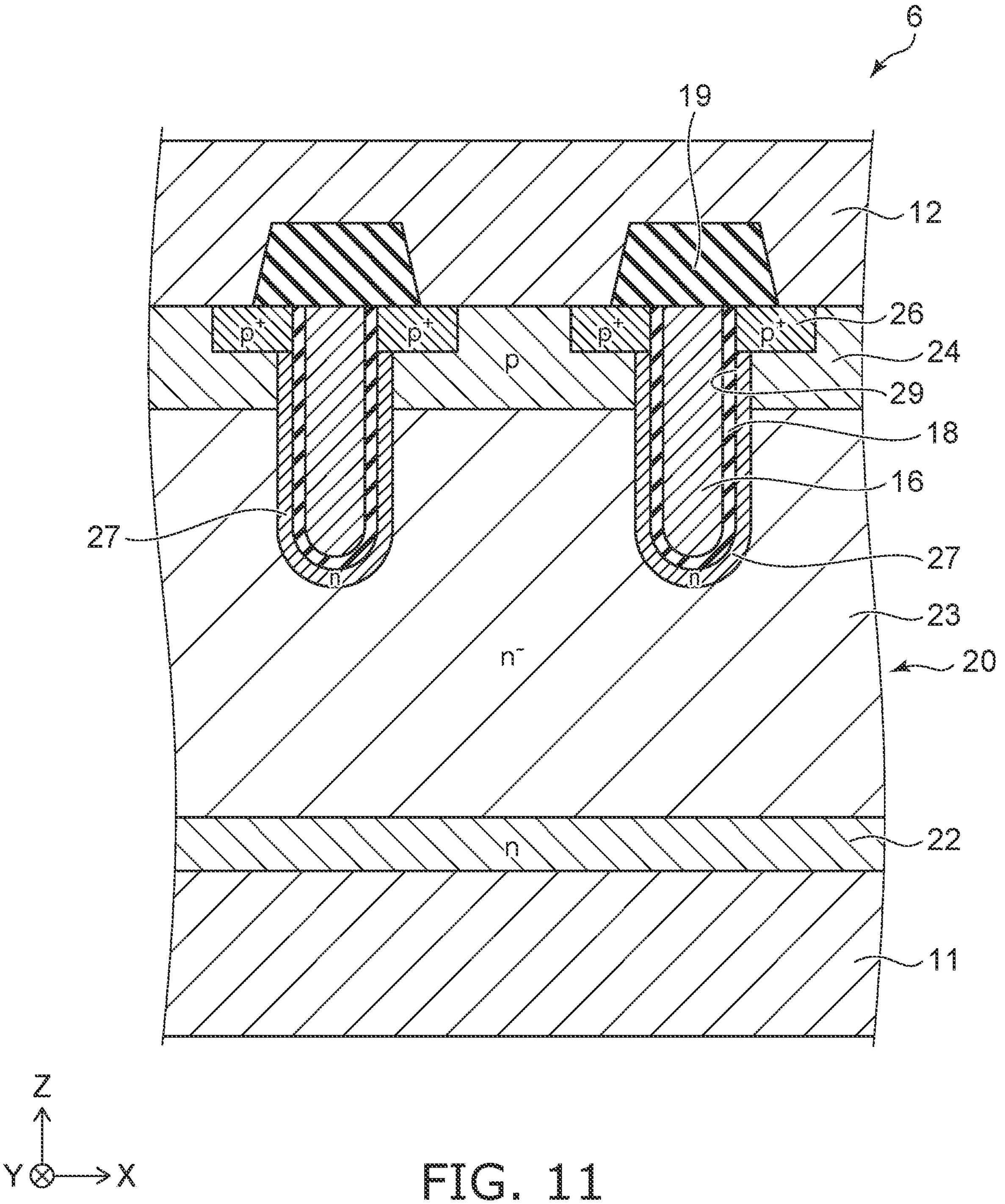
FIG. 11 is a cross-sectional view showing a semiconductor device according to a sixth embodiment.

FIG. 11 is a cross-sectional view showing a semiconductor device according to the embodiment.

In the semiconductor device 6 according to the embodiment as shown in FIG. 11, the sidewall n-type layer 27 also is located between the FWD gate insulating film 18 and the p-type base/anode layer 24. For example, the sidewall n-type layer 27 contacts the lower surface of the $p^+$-type contact layer 26. Therefore, holes are injected less easily in the period T2 directly before the recovery operation; and the recovery loss in the recovery operation period T3 can be further reduced. Otherwise, the configuration, operations, and effects according to the embodiment are similar to those of the first embodiment.

Seventh Embodiment

Figure 12:
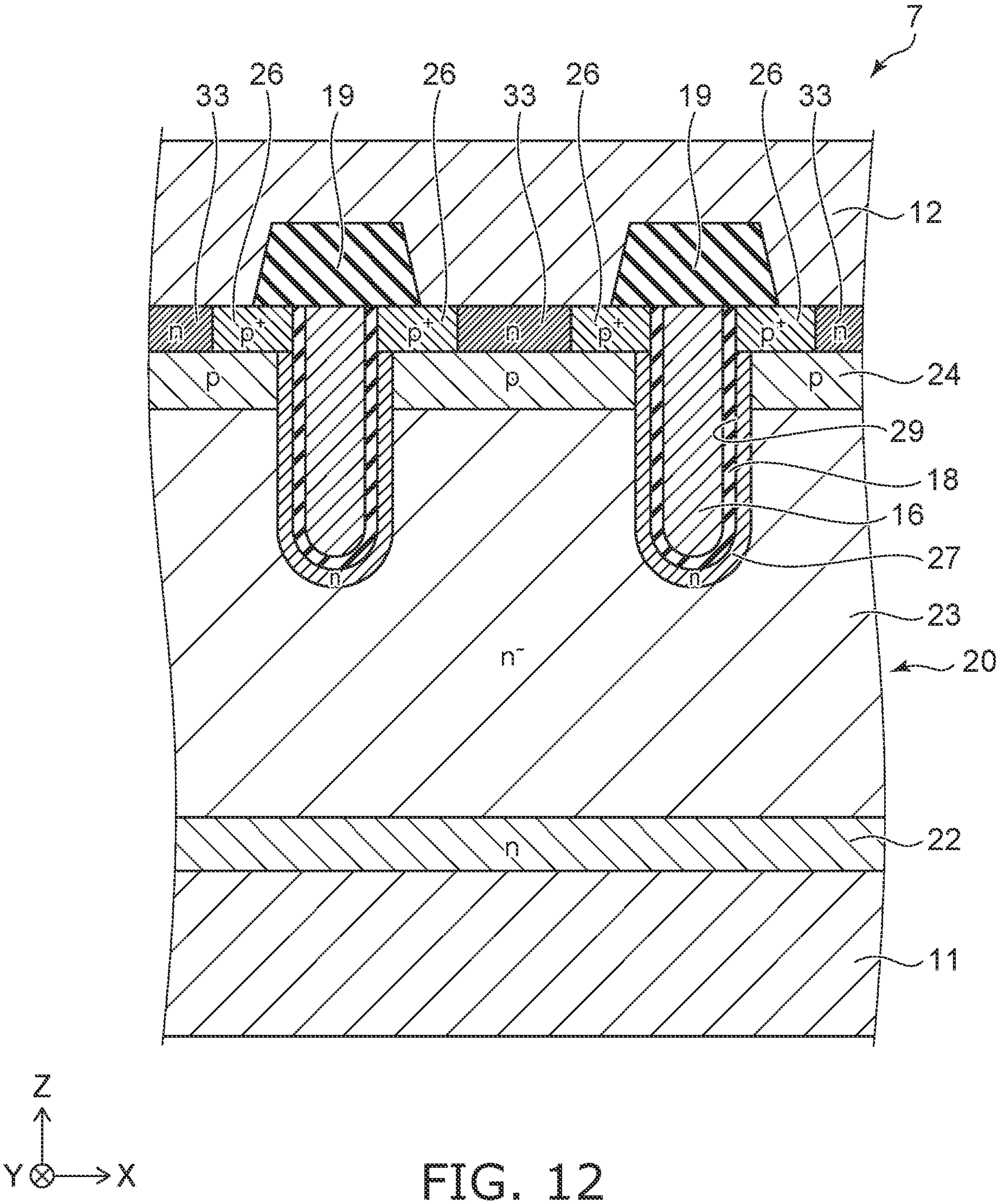
FIG. 12 is a cross-sectional view showing a semiconductor device according to a seventh embodiment.

FIG. 12 is a cross-sectional view showing a semiconductor device according to the embodiment.

The semiconductor device 7 according to the embodiment as shown in FIG. 12 includes an n-type collector layer 33 in addition to the configuration of the semiconductor device 6 according to the sixth embodiment. The conductivity type of the n-type collector layer 33 is the n-type; and the n-type collector layer 33 has a higher carrier concentration than the $n^-$-type drift layer 23. The n-type collector layer 33 is located between the p-type base/anode layer 24 and the upper surface electrode 12, contacts the p-type base/anode layer 24, the $p^+$-type contact layer 26, and the upper surface electrode 12, and is separated from the $n^-$-type drift layer 23 and the sidewall n-type layer 27.

In the FWD region $R_{FWD}$ of the example shown in FIG. 12, the upper surface electrode 12 contacts the $p^+$-type contact layer 26 and the n-type collector layer 33 but does not contact the p-type base/anode layer 24. However, the upper surface electrode 12 may contact the p-type base/anode layer 24 as well as the $p^+$-type contact layer 26 and the n-type collector layer 33 in the FWD region $R_{FWD}$. Otherwise, the configuration, operations, and effects according to the embodiment are similar to those of the sixth embodiment.

According to the embodiments described above, a semiconductor device can be realized in which the power loss can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

Embodiments include the following aspects.

Note 1

A semiconductor device, comprising:
- a first electrode;
- a first semiconductor layer connected to the first electrode, the first semiconductor layer being of a first conductivity type;
- a second semiconductor layer contacting the first semiconductor layer, the second semiconductor layer being of a second conductivity type;
- a second electrode connected to the second semiconductor layer;
- a third electrode;
- a first insulating film located between the third electrode and the first semiconductor layer and between the third electrode and the second semiconductor layer, the first insulating film contacting the third electrode; and
- a third semiconductor layer located between the first insulating film and the first semiconductor layer in a second direction orthogonal to a first direction, the first direction being from the first electrode toward the second electrode, the third semiconductor layer contacting the first insulating film and the first semiconductor layer, the third semiconductor layer being of the first conductivity type, the third semiconductor layer having a higher carrier concentration than the first semiconductor layer.

Note 2

The device according to note 1, wherein the third semiconductor layer is located between the first insulating film and the first semiconductor layer in the first direction, Note 3

The device according to note 1, wherein the first insulating film contacts the first semiconductor layer in the first direction.

Note 4

The device according to note 1 or 3, further comprising:

a fourth semiconductor layer located between the first insulating film and the first semiconductor layer in the first direction, the fourth semiconductor layer being of the second conductivity type.

Note 5

The device according to note 4, wherein the third electrode extends in a third direction orthogonal to the first and second directions, the fourth semiconductor layer is located between the first semiconductor layer and an end portion in the third direction of the third electrode, and the fourth semiconductor layer is not located in at least a partial region between the first semiconductor layer and a central portion in the third direction of the third electrode.

Note 6

The device according to note 4 or 5, wherein a plurality of the fourth semiconductor layers is separated from each other in the second direction.

Note 7

The device according to any one of notes 1-6, wherein the third semiconductor layer also is located between the first insulating film and the second semiconductor layer.

Note 8

A semiconductor device, comprising:

a first electrode;

a first semiconductor layer connected to the first electrode, the first semiconductor layer being of a first conductivity type;

a second semiconductor layer of a second conductivity type;

a second electrode connected to the second semiconductor layer;

a third electrode;

a first insulating film located between the third electrode and the first semiconductor layer and between the third electrode and the second semiconductor layer, the first insulating film contacting the third electrode; and a third semiconductor layer located between the first insulating film and the first semiconductor layer and between the first semiconductor layer and the second semiconductor layer, the third semiconductor layer contacting the first insulating film, the first semiconductor layer, and the second semiconductor layer, the third semiconductor layer being of the first conductivity type, the third semiconductor layer having a higher carrier concentration than the first semiconductor layer.

Note 9

The device according to any one of notes 1-3 and 8, further comprising:

a fourth semiconductor layer contacting the second semiconductor layer and the second electrode, the fourth semiconductor layer being separated from the first semiconductor layer, the fourth semiconductor layer being of the first conductivity type.

Note 10

The device according to any one of notes 1-3 and 8, further comprising:

a fourth electrode;

a fourth semiconductor layer contacting the first electrode and the first semiconductor layer, the fourth semiconductor layer being of the second conductivity type;

a fifth semiconductor layer contacting the second electrode and the second semiconductor layer, the fifth semiconductor layer being of the first conductivity type; and a second insulating film located between the fourth electrode and the first semiconductor layer, between the fourth electrode and the second semiconductor layer, and between the fourth electrode and the fifth semiconductor layer, the second insulating film contacting the fourth electrode.

Note 11

The device according to note 10, further comprising:

a first pad connected to the third electrode; and a second pad connected to the fourth electrode, the second pad being insulated from the first pad.

Note 12

The device according to note 10 or 11, wherein the first conductivity type is an n-type, the second conductivity type is a p-type, and the device realizes:

a first period in which a negative voltage is applied to the fourth electrode, and a negative voltage is applied to the third electrode;

a second period following the first period, in which a negative voltage is applied to the fourth electrode, and a positive voltage is applied to the third electrode; and a third period following the second period, in which a positive voltage is applied to the fourth electrode.

Note 13

The device according to note 12, wherein a length of the second period is not less than 1 μs and not more than 10 μs.

What is claimed is:

1. A semiconductor device, comprising:

a first electrode;

a first semiconductor layer connected to the first electrode, the first semiconductor layer being of a first conductivity type;

a second semiconductor layer contacting the first semiconductor layer, the second semiconductor layer being of a second conductivity type;

a second electrode connected to the second semiconductor layer;

a third electrode;

a first insulating film located between the third electrode and the first semiconductor layer and between the third electrode and the second semiconductor layer, the first insulating film contacting the third electrode;

a third semiconductor layer located between the first insulating film and the first semiconductor layer in a second direction orthogonal to a first direction, the first direction being from the first electrode toward the second electrode, the third semiconductor layer contacting the first insulating film and the first semiconductor layer, the third semiconductor layer being of the first conductivity type, the third semiconductor layer having a higher carrier concentration than the first semiconductor layer;

a fourth electrode;

a fourth semiconductor layer contacting the first electrode and the first semiconductor layer, the fourth semiconductor layer being of the second conductivity type;

a fifth semiconductor layer contacting the second electrode and the second semiconductor layer, the fifth semiconductor layer being of the first conductivity type; and a second insulating film located between the fourth electrode and the first semiconductor layer, between the fourth electrode and the second semiconductor layer, and between the fourth electrode and the fifth semiconductor layer, the second insulating film contacting the fourth electrode.

2. The device according to claim 1, wherein the third semiconductor layer is located between the first insulating film and the first semiconductor layer in the first direction.

3. The device according to claim 1, wherein the first insulating film contacts the first semiconductor layer in the first direction.

4. The device according to claim 1, further comprising:

a sixth semiconductor layer located between the first insulating film and the first semiconductor layer in the first direction, the sixth semiconductor layer being of the second conductivity type.

5. The device according to claim 4, wherein the third electrode extends in a third direction orthogonal to the first and second directions, the sixth semiconductor layer is located between the first semiconductor layer and an end portion in the third direction of the third electrode, and the sixth semiconductor layer is not located in at least a partial region between the first semiconductor layer and a central portion in the third direction of the third electrode.

6. The device according to claim 4, wherein a plurality of the sixth semiconductor layers is separated from each other in the second direction.

7. The device according to claim 1, wherein the third semiconductor layer also is located between the first insulating film and the second semiconductor layer in the second direction.

8. The device according to claim 1, further comprising:

a seventh semiconductor layer contacting the second semiconductor layer and the second electrode, the seventh semiconductor layer being separated from the first semiconductor layer, the seventh semiconductor layer being of the first conductivity type.

9. The device according to claim 1, further comprising:

a first pad connected to the third electrode; and a second pad connected to the fourth electrode, the second pad being insulated from the first pad.

10. The device according to claim 1, wherein the first conductivity type is an n-type, the second conductivity type is a p-type, and the device realizes:

a first period in which a negative voltage is applied to the fourth electrode, and a negative voltage is applied to the third electrode;

a second period following the first period, in which a negative voltage is applied to the fourth electrode, and a positive voltage is applied to the third electrode; and a third period following the second period, in which a positive voltage is applied to the fourth electrode.

11. The device according to claim 10, wherein a length of the second period is not less than 1 μs and not more than 10 μs.

12. A semiconductor device, comprising:

a first electrode;

a first semiconductor layer connected to the first electrode, the first semiconductor layer being of a first conductivity type;

a second semiconductor layer of a second conductivity type;

a second electrode connected to the second semiconductor layer;

a third electrode;

a first insulating film located between the third electrode and the first semiconductor layer and between the third electrode and the second semiconductor layer, the first insulating film contacting the third electrode; and a third semiconductor layer located between the first insulating film and the first semiconductor layer and between the first semiconductor layer and the second semiconductor layer, the third semiconductor layer contacting the first insulating film, the first semiconductor layer, and the second semiconductor layer, the third semiconductor layer being of the first conductivity type, the third semiconductor layer having a higher carrier concentration than the first semiconductor layer;

a fourth electrode;

a fourth semiconductor layer contacting the first electrode and the first semiconductor layer, the fourth semiconductor layer being of the second conductivity type;

a fifth semiconductor layer contacting the second electrode and the second semiconductor layer, the fifth semiconductor layer being of the first conductivity type; and a second insulating film located between the fourth electrode and the first semiconductor layer, between the fourth electrode and the second semiconductor layer, and between the fourth electrode and the fifth semiconductor layer, the second insulating film contacting the fourth electrode.

13. The device according to claim 12, further comprising:

a seventh semiconductor layer contacting the second semiconductor layer and the second electrode, the seventh semiconductor layer being separated from the first semiconductor layer, the seventh semiconductor layer being of the first conductivity type.

14. The device according to claim 12, further comprising:

a first pad connected to the third electrode; and a second pad connected to the fourth electrode, the second pad being insulated from the first pad.

15. The device according to claim 12, wherein the first conductivity type is an n-type, the second conductivity type is a p-type, and the device realizes:

a first period in which a negative voltage is applied to the fourth electrode, and a negative voltage is applied to the third electrode;

a second period following the first period, in which a negative voltage is applied to the fourth electrode, and a positive voltage is applied to the third electrode; and a third period following the second period, in which a positive voltage is applied to the fourth electrode.

16. The device according to claim 15, wherein a length of the second period is not less than 1 μs and not more than 10 μs.

17. A semiconductor device, comprising:

a first electrode;

a first semiconductor layer connected to the first electrode, the first semiconductor layer being of a first conductivity type;

a second semiconductor layer contacting the first semiconductor layer, the second semiconductor layer being of a second conductivity type;

a second electrode connected to the second semiconductor layer;

a third electrode;

a first insulating film located between the third electrode and the first semiconductor layer and between the third electrode and the second semiconductor layer, the first insulating film contacting the third electrode; and a third semiconductor layer being of the first conductivity type, the third semiconductor layer having a higher carrier concentration than the first semiconductor layer, the third semiconductor layer covering a bottom portion of the first insulating film, the bottom portion of the first insulating film being closest to the first electrode.

18. The device according to claim 17, wherein the third semiconductor layer is located between the first insulating film and the second semiconductor layer.

19. The device according to claim 17, further comprising:

a sixth semiconductor layer contacting the second semiconductor layer and the second electrode, the sixth semiconductor layer being separated from the first semiconductor layer, the sixth semiconductor layer being of the first conductivity type.

20. The device according to claim 17, wherein the third semiconductor layer continuously covers one side surface of the first insulating film in a second direction, a bottom surface of the first insulating film in a first direction, and an opposite surface of the first insulating film in the second direction, the first direction being from the first electrode toward the second electrode, the second direction being orthogonal to the first direction.

* * * * *